United States Patent
Ongstad et al.

(10) Patent No.: US 7,469,002 B1
(45) Date of Patent: Dec. 23, 2008

(54) MID-INFRARED OPTICALLY PUMPED UNSTABLE RESONATOR LASER

(75) Inventors: Andrew Ongstad, Albuquerque, NM (US); Ron Kaspi, Albuquerque, NM (US); Greg Dente, Albuquerque, NM (US); Michael Tilton, Albuquerque, NM (US); Joseph R. Chavez, Albuquerque, NM (US)

(73) Assignee: The United States of America as represented by the Secretary of the Air Force, Washington, DC (US)

( * ) Notice: Subject to any disclaimer, the term of this patent is extended or adjusted under 35 U.S.C. 154(b) by 213 days.

(21) Appl. No.: 11/467,602

(22) Filed: Aug. 28, 2006

(51) Int. Cl.
 *H01S 3/08* (2006.01)
(52) U.S. Cl. .................. 372/95; 372/43.01
(58) Field of Classification Search ........... 372/95, 372/43.01
 See application file for complete search history.

(56) References Cited

U.S. PATENT DOCUMENTS 4,739,508 A * 4/1988 Clark ..................... 372/95
5,179,568 A   1/1993 Lang
5,438,585 A * 8/1995 Armour et al. ........ 372/45.01

OTHER PUBLICATIONS

G. C. Dente, et.al., MIOMD-VII, Lancaster U. Conf., Sep. 12-14, 2005.
Optically Pumped MIR Lasers; R. Kaspi, G.C. Dente, A.P. Ongstad Mid-Infrared Optoelectronic Materials and Devices, Edited by Anthony Krier, Date not provided.
Tilton, M.L., Dente, G. C., Paxton, A. H., Cser, J., DeFreez, R.K., Moeller, C.E. and Depatie, D., IEEE J. Quantum Electron., 1991, 27 (9), 2098.
Srinivasan, S.T., Schaus, C.F., Sun, S.Z., Armour, E.A., Hersee, S.D., McInerney, J.G. Appl. Phys. Lett., 1992, 61, 11, 1272.
Dente, G. C., IEEE J. Quant. Electron. 2001, 37 (12), 1650.

* cited by examiner

*Primary Examiner*—Dung T Nguyen
(74) *Attorney, Agent, or Firm*—Kenneth E. Callahan

(57) ABSTRACT

A high-powered mid-IR antimonide-based unstable resonator semiconductor laser that is optically pumped. One Fabry-Perot facet is a mechanically polished cylindrical mirror that extends well into the GaSb substrate. The waveguide is designed to weakly confine the transverse optical mode, and the optical pump stripe width can be varied to optimize the cavity width for high brightness operation.

4 Claims, 5 Drawing Sheets

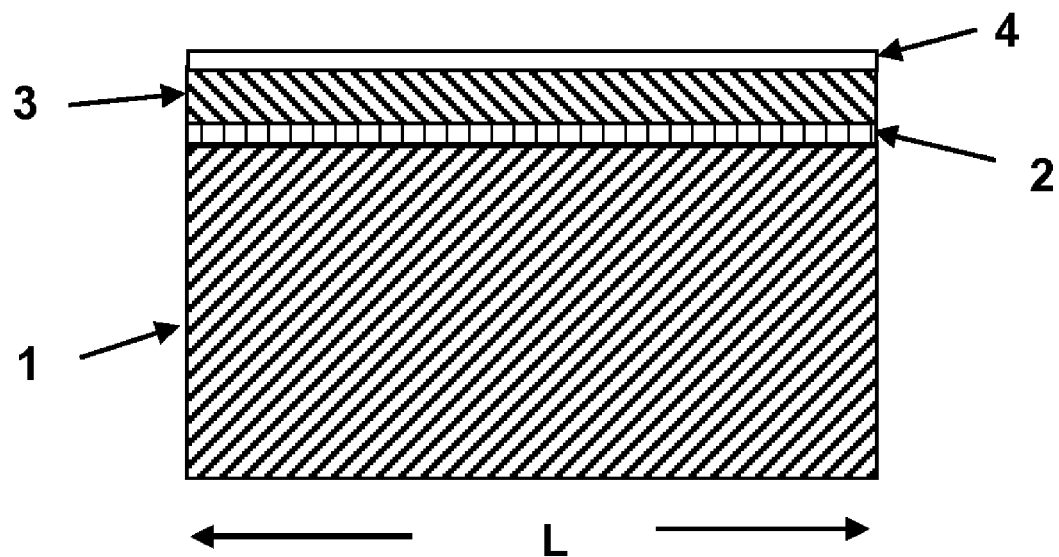
FIG. 1
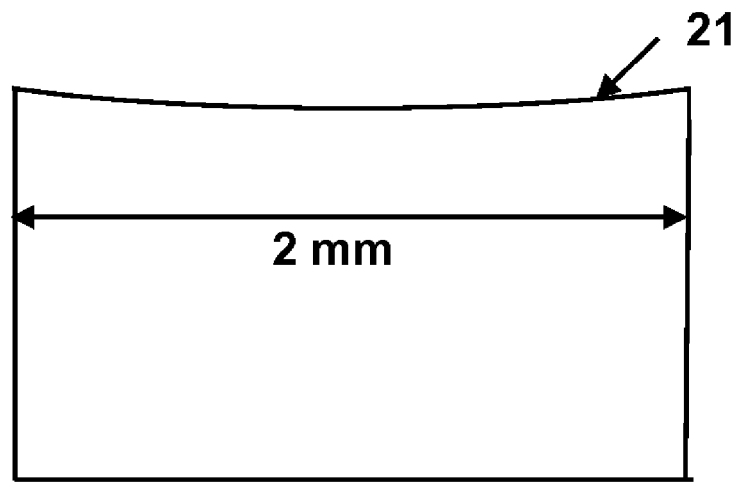
FIG. 2 (FIG. 1 viewed from the top)

Fabry-Perot
Virtual Source Reimage

Unstable Resonator
Virtual Source Re-image

30 X threshold

25 X threshold

MID-INFRARED OPTICALLY PUMPED UNSTABLE RESONATOR LASER

STATEMENT OF GOVERNMENT INTEREST

The conditions under which this invention was made are such as to entitle the Government of the United States under paragraph I(a) of Executive Order 10096, as represented by the Secretary of the Air Force, to the entire right, title and interest therein, including foreign rights.

BACKGROUND OF THE INVENTION

The invention relates generally to high-power, mid-IR optically pumped unstable resonator lasers and in particular to a means to produce a high-power output while maintaining a near diffraction-limited beam.

High power optically pumped mid-IR lasers have been demonstrated with peak powers in the 5 to 15 W range, CW powers in excess of 2 W, and lasing wavelengths in the 2 to 10 micron region. However, these broad area lasers typically display degraded beam quality as the pump intensity is increased; they may go from 2-3 times diffraction limited near threshold to 8-15 times diffraction-limited at ~30 times threshold. This limits the devices applicability since it becomes difficult to couple the radiation into a small numerical aperture fiber or to focus the radiation in the far field. There are a large number of applications that would directly benefit from high power mid-IR output in a nearly diffraction limited beam. These applications include infrared countermeasures, free-space optical communication, remote sensing, laser marking, and various medical applications.

A number of approaches have been utilized in near-IR semiconductor diode lasers (electrically pumped lasers) to achieve high-power operation with diffraction limited output. These include tapered amplifiers, angled injection into traveling wave or reflective wave amplifiers, coupled narrow stripe lasers, and various unstable resonator (UR) geometries. The UR laser concept is best understood by comparing it to the conventional Fabry-Perot (FP) laser. The conventional semiconductor laser uses an FP cavity defined by two parallel mirrors. The lasing mode undergoes multiple reflections at the cavity mirrors and the mode is directly counter-propagated. In contrast, the UR laser is characterized by counter-propagating diverging cylindrical waves diverging from fixed virtual source points. By avoiding direct counter-propagation UR's suppress filamentation and maintain excellent beam quality with all the radiation diverging from fixed high-brightness virtual source points. Consequently, the UR laser is a high brightness source since near diffraction-limited beam quality can be preserved even with broad laser cavities and under conditions of high current injection or optical pumping.

In one approach to the UR design for electrically injected semiconductor lasers, as described in U.S. Pat. No. 5,179,568, the UR cavity was formed with curved facets for the end mirrors. However, a high precision manufacturing process, such as ion-beam milling, was required to maintain losses at the mirrors within acceptable limits. The required high-precision does not permit such devices to be formed in quantity and with reasonable reproducibility.

In another approach a train of weak negative lenses is grown into the structure and causes the main mode to expand laterally as it propagates. However, for large changes in the index of refraction each lens will act as a reflecting surface and will introduce further losses in the cavity. (Paxton et. al. "Semiconductor Laser with Regrown-Lens-Train Unstable Resonator: Theory and Design," 29, IEEE J. Quant. Electron. No. 11, pp 2784-2792, 1993)

In another approach to the UR design for electrically injected semiconductor lasers, as described in U.S. Pat. No. 5,438,585 an anti-guide region is optically coupled to the active region of the laser. The anti-guide region has a lateral variation in the effective index of refraction that forms a diverging medium that causes higher order modes to experience higher losses in the resonant cavity. However, the main mode suffers higher losses as well and the growth of this structure requires multiple epitaxial growth steps thereby complicating the fabrication process.

SUMMARY OF THE INVENTION

A high-brightness optically pumped mid-infrared semiconductor laser is formed by the mechanical polishing of a cylindrical mirror directly on one of the facets of a mid-infrared Fabry-Perot laser cavity. The presence of the cylindrical mirror forces the counter-propagating cylindrical optical modes to diverge from fixed virtual source points and reduces the tendency of the cavity to self focus or form optical filaments. These features improve the beam quality of the laser. Furthermore, the cavity width or gain volume can be significantly increased thereby significantly increasing the extractable power while still maintaining a nearly-diffraction limited beam.

BRIEF DESCRIPTION OF THE DRAWINGS

FIG. 1 shows a representative mid-IR quantum well laser viewed in cross-section.

FIG. 2 is a top-down view of the UR laser of FIG. 1 showing the cylindrical mirror on one end.

DESCRIPTION OF THE PREFERRED EMBODIMENT

The process begins by fabricating a Fabry-Perot (FP) laser. The FP laser is a mid-infrared quantum well laser. A representative quantum well laser is shown in FIG. 1. In brief, the different layers of the structure are grown in a molecular beam epitaxial (MBE) chamber on a GaSb substrate 1. The laser active region 2 (light emitting region) is deposited on the substrate followed by a thicker layer of GaSb 3. A final protective cap layer 4 is grown on top.

A semiconductor laser chip of length L is cleaved out of the host wafer thereby forming a FP laser cavity. The optically pumped unstable resonator (OPUR) is then formed by mechanically polishing a cylindrical mirror on one end of the FP laser.

Figure 3:
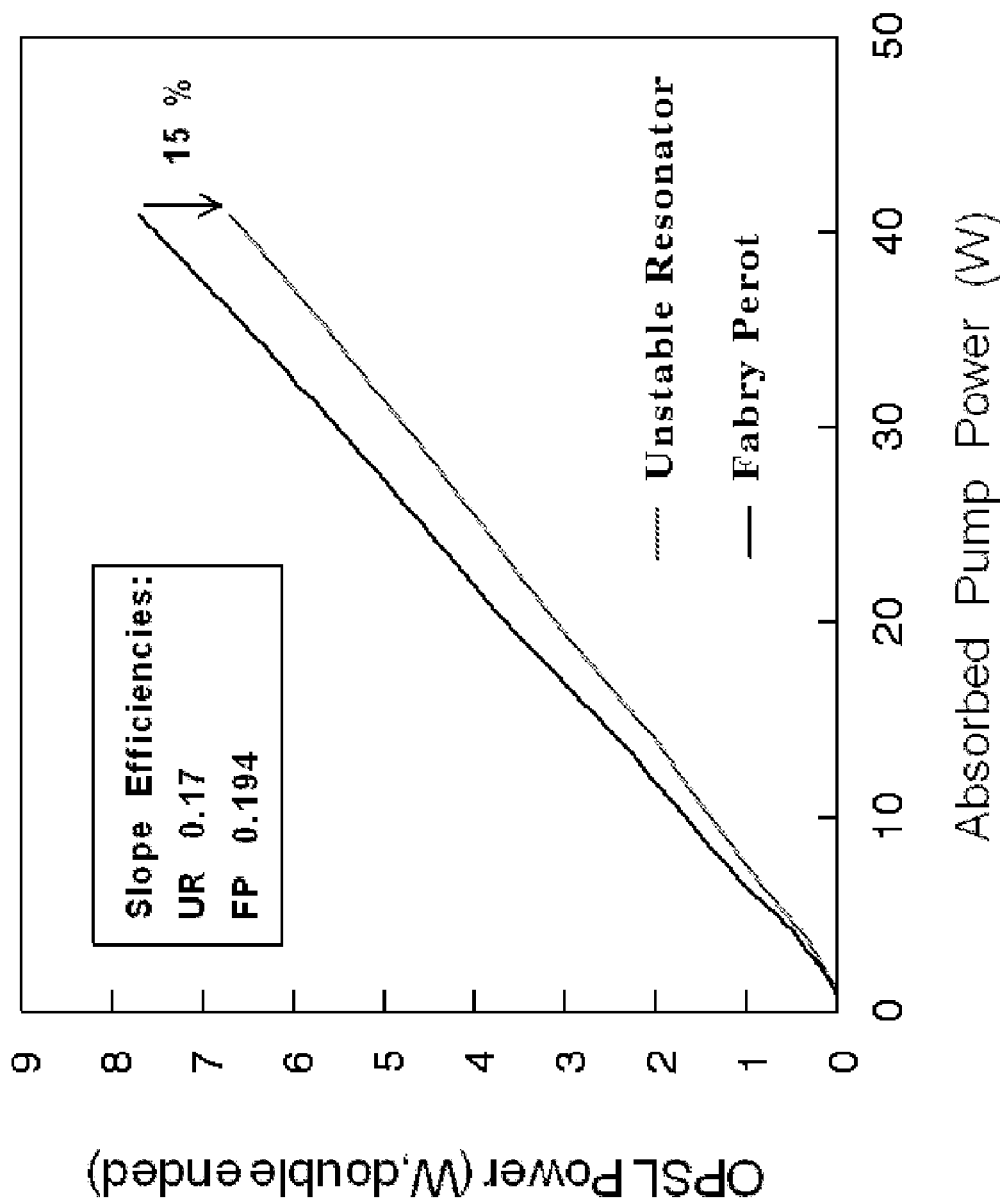
FIG. 3 is a comparison plot of the output power from an optically pumped unstable laser vs. a Fabry-Perot laser.

In the mechanical polishing process the mirror is formed by a procedure in which the chip is first sandwiched between two metal blocks. On one side of the blocks cylindrical templates have previously been milled, conforming to the correct cylindrical figure. When the antimonide-based chip is sandwiched between them, properly aligned, and mechanically polished, a high-quality cylinder is formed with the desired radius of curvature and minimal facet damage. A typical top-down image of the UR laser is shown in FIG. 2 with an exaggerated cylindrical curvature 21. The mirror sag is actually about 50 microns across the 2 mm wide chip in this example. An advantage of optical pumping is the ability to incorporate a waveguide design in which the transverse optical mode is weakly confined. This allows the transverse mode to extend far beyond the active region, i.e., the transverse mode extends well into the GaSb substrate, reaching approximately 10 µm below the surface of the epilayers. Consequently, the cylindrical mirror 21 must extend down at least this far into the substrate. This can readily be accomplished using the mechanical polishing technique described. The polishing process is highly robust such that there is no major facet damage and only a small drop (≈5-15%) in the slope efficiency is observed in the operation of the OPUR as compared to the Fabry-Perot as can be seen in FIG. 3.

Figure 4:
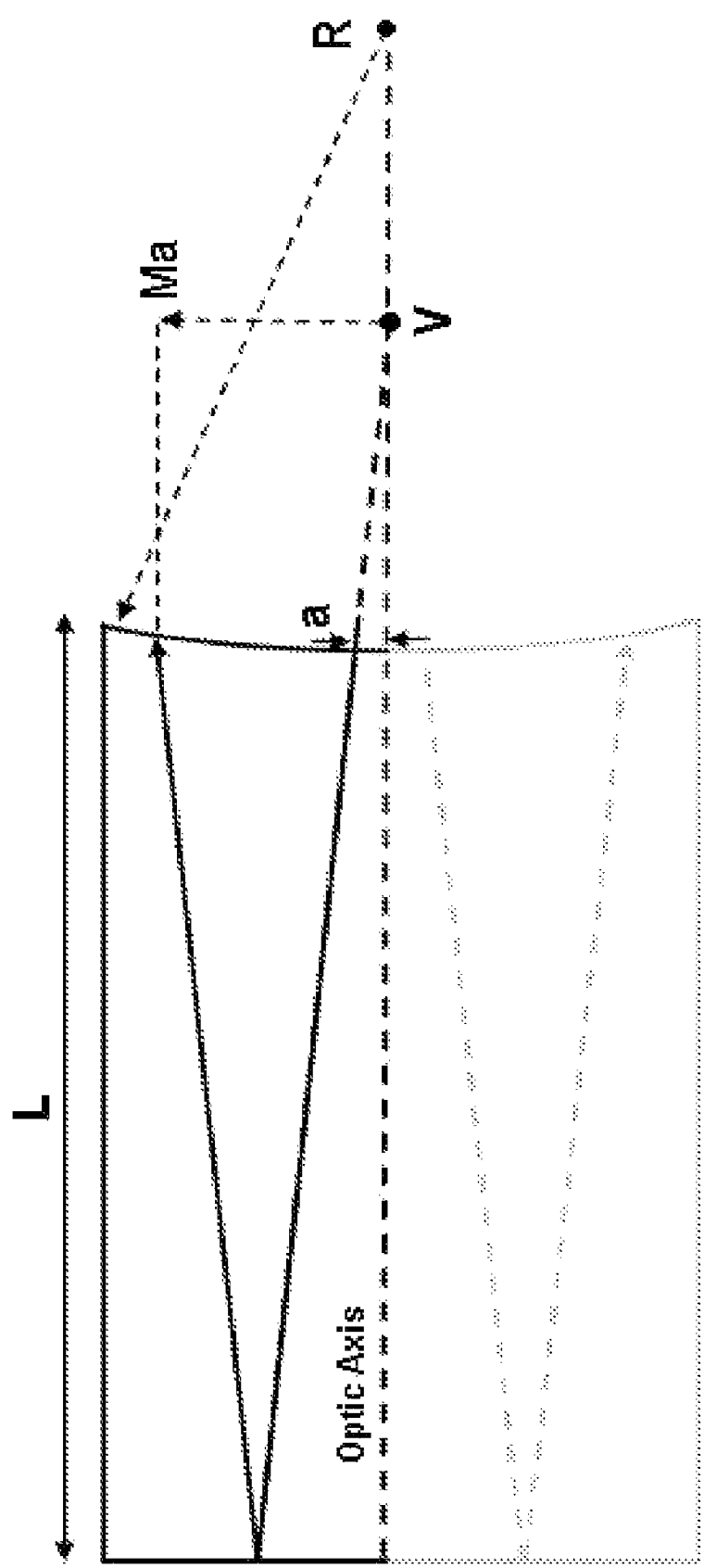
FIG. 4 illustrates the concept of unstable resonator magnification.

A majority of this drop in power is due to the extra loss of the cavity due to geometric magnification of the radiation in the OPUR cavity. This resonator magnification, M, is conveniently quantified as:

$$M = \frac{V+L}{V-L} = \frac{\sqrt{L^2+RL}+L}{\sqrt{L^2+RL}-L}$$

where L is the cavity length and R is the cylindrical mirrors radius of curvature. Typical magnifications for the OPUR are from 2 to 4. FIG. 4 illustrates the concept of unstable resonator magnification.

Figure 5:
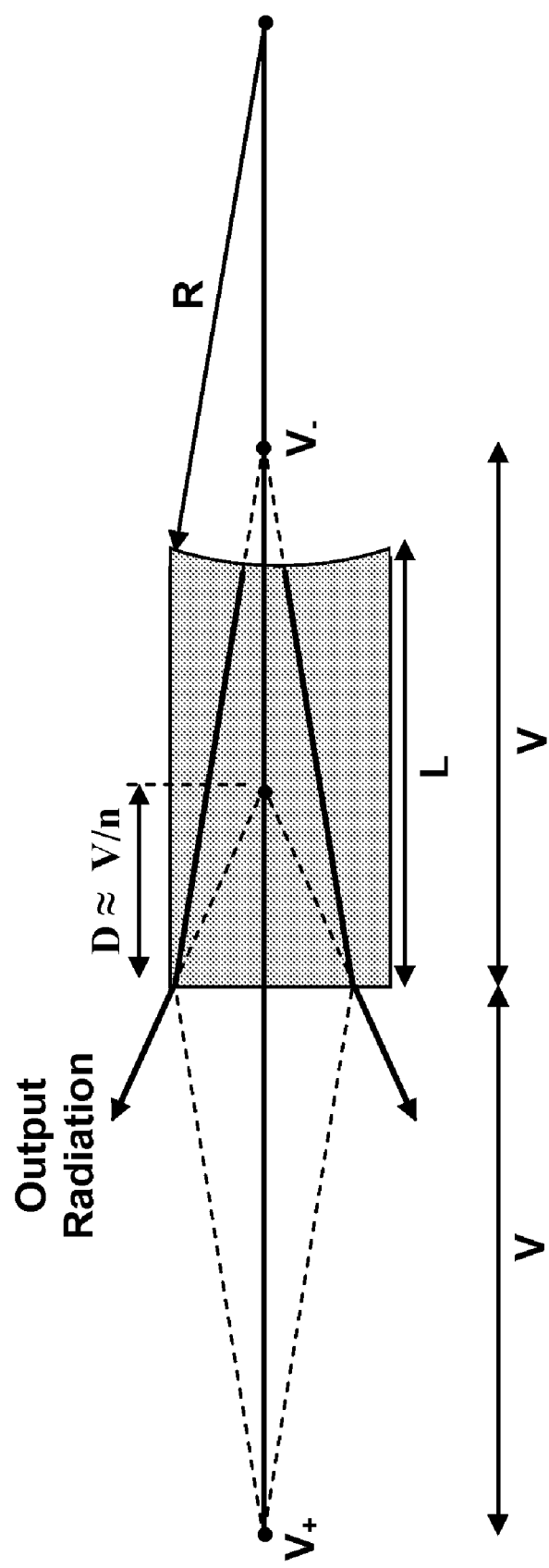
FIG. 5 is a schematic of an unstable resonator showing virtual source points.

Regenerative re-imaging of the circulating radiation is the critical mechanism leading to high brightness from the virtual source points. These virtual source points, shown as V+ and V− in FIG. 5, are located at a distance V=±√(L²+LR) from the flat facet. The left virtual source, V+, is at an object distance (V+L) from the diverging mirror with focal length (−R/2). Upon reflection from the curved facet, the radiation forms a virtual image, V−, at a distance (V−L) to the right of the curved facet.

In actual operation, the radiation is outcoupled from the flat facet side of the device, so that the virtual waist of the lateral mode is located behind the output facet at a refractively reduced distance, D=V/n, in which the index of refraction is given by n=3.82. For a typical device geometry with L=3500 µm and R=10000 µm, this reduced distance is inside the device at approximately 1800 µm from the flat facet. In addition to the high brightness generated by the regenerative re-imaging of the virtual source points, the natural divergence of the propagating mode tends to mitigate self-focusing filamentation, leading to further brightness improvements.

Figures 6, 6A, 6B:
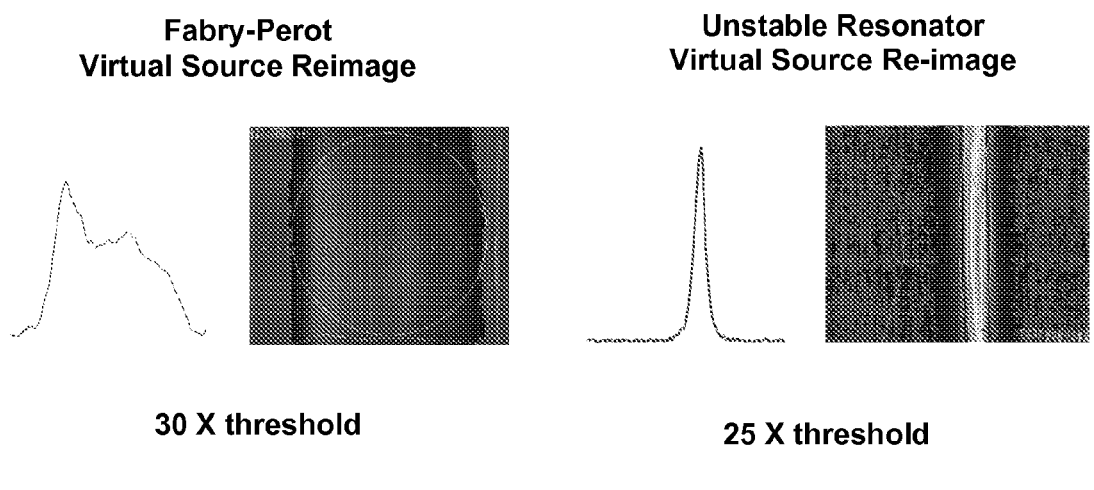
FIG. 6a is a reimaged virtual source point for a Fabry-Perot device at 30 times threshold.
FIG. 6b is a reimaged virtual source point for a mid-IR unstable resonator device at 25 times threshold.

FIG. 6 shows a comparison of a re-imaged virtual source point for a Fabry-Perot device (FIG. 6a) and for a mid-IR unstable resonator device (FIG. 6b) taken at 30 and 25 times threshold, respectively. For these devices, the far-field is realized by re-imaging the high-brightness virtual source point located a distance D from the flat facet. This is shown in FIG. 3 for an unstable resonator semiconductor laser operating at ~4.6 µm and at a high peak power of 6.7 W. This device was observed to be nearly diffraction limited at 5 and 25 times threshold. In comparison, a standard Fabry-Perot laser was observed to be 6 to 8 times diffraction limited when operated under similar conditions.

One advantage of this embodiment of a mid-IR, antimonide based, optically-pumped, unstable resonator (OPUR) laser is the ease with which it is manufactured. A simple, yet robust, mechanical polishing procedure is used to manufacture a high-quality cylindrical mirror with the correct radius of curvature. Further, the process lends itself to batch processing in which several chips are stacked and polished at the same time. This manufacturing method is easily scaled to permit volume production. The ease of manufacturing the OPUR may be contrasted with ion beam milling and photolithographic methods which have previously been used to manufacture unstable resonators. The requirement for producing optical quality curved mirrors places severe demands on the photolithography or ion-beam milling process.

Another advantage of the OPUR is that it constitutes a true high brightness source for broad-area, optically pumped, mid-IR lasers; i.e., it retains near diffraction limited output even under the highest pump power conditions. There is no analogy of such a high brightness semiconductor source in the mid-IR. A third advantage of the OPUR involves the incorporation of a dilute waveguide structure (transverse optical mode is weakly confined) with the unstable resonator concept. The combination of a dilute waveguide structure with an unstable resonator design is extremely powerful since both tend to mitigate against optical filamentation and beam break-up. Filamentation is a major mechanism leading to severely degraded beam-quality and loss of brightness. Combining a dilute waveguide design with a UR in an electrically injected semiconductor laser is problematical since the series resistance would increase significantly leading to higher laser thresholds and significant heating.

Furthermore, the cavity width of an OPUR is not fixed as it is in electrically pumped devices. Due to the nature of optical pumping, the lateral pump stripe width in the OPUR can be varied continuously in real time. The cavity width, defined by the optical pumping, can be varied over a wide range from ≈100 µm out to greater than 1000 µm. This allows maximal flexibility when optimizing the OPUR cavity for high brightness operation. The pump stripe width may be adjusted to significantly reduce heating effects and thermal ducting, which tend to degrade beam quality.

The invention claimed is:

1. A high-power unstable resonator semiconductor laser that is optically-pumped with an optical pump stripe width, said laser comprising
    an antimonide-based mid-infrared Fabry-Perot quantum well laser chip comprised of a GaSb substrate, an active region, an upper cladding, and a protective cap;
    a mechanically polished cylindrical mirror facet at one end of said Fabry-Perot chip, whereby an unstable resonator is produced;
    a waveguide in which the transverse optical mode is weakly confined; and
    a wide cavity width defined by said optical pump stripe width.

2. The laser of claim 1, wherein said cylindrical mirror facet extends into said GaSb substrate.

3. The laser of claim 2, wherein said cylindrical mirror facet extends at least 10 microns into said GaSb substrate.

4. A high-power unstable resonator semiconductor laser that is optically-pumped with an optical pump stripe width, said laser comprising
    an antimonide-based mid-infrared Fabry-Perot quantum well laser chip comprised of a GaSb substrate, an active region, an upper cladding, and a protective cap;

a mechanically polished cylindrical mirror facet at one end of said Fabry-Perot chip extending at least 10 microns into said GaSb substrate, whereby an unstable resonator is produced;

a waveguide in which the transverse optical mode is weakly confined; and a wide cavity width defined by said optical pump stripe width that can be varied continuously between 100 microns and 1000 microns, whereby said laser can be optimized for high brightness operation.

* * * * *